United States Patent
Bewlay

(10) Patent No.: US 9,157,359 B2
(45) Date of Patent: Oct. 13, 2015

(54) EXHAUST ENERGY RECOVERY FOR ENGINES

(71) Applicant: Empire Technology Development LLC, Wilmington, DE (US)

(72) Inventor: Stephen L. Bewlay, Kaleen (AU)

(73) Assignee: Empire Technology Development LLC, Wilmington, DE (US)

( * ) Notice: Subject to any disclaimer, the term of this patent is extended or adjusted under 35 U.S.C. 154(b) by 63 days.

(21) Appl. No.: 13/976,440

(22) PCT Filed: Sep. 28, 2012

(86) PCT No.: PCT/AU2012/001187
§ 371 (c)(1),
(2) Date: Jun. 26, 2013

(87) PCT Pub. No.: WO2014/047671
PCT Pub. Date: Apr. 3, 2014

(65) Prior Publication Data
US 2014/0238005 A1   Aug. 28, 2014

(51) Int. Cl.
*F01N 3/00* (2006.01)
*F01N 3/02* (2006.01)
(Continued)

(52) U.S. Cl.
CPC *F01N 5/025* (2013.01); *F01N 5/02* (2013.01); *F02G 5/02* (2013.01); *F28D 21/0003* (2013.01);
(Continued)

(58) Field of Classification Search
CPC ....... F01N 5/02; F01N 5/025; F01N 2240/02; F02G 5/02; F28D 21/0003; Y02T 10/166
USPC .................................................. 60/298, 320
See application file for complete search history.

(56) References Cited

U.S. PATENT DOCUMENTS

| 3,297,492 A | 1/1967 | Pepper |
| 4,095,998 A | 6/1978 | Hanson |

(Continued)

FOREIGN PATENT DOCUMENTS

| FR | 2918112 A1 | 1/2009 |
| JP | 2002325470 A2 | 11/2002 |

(Continued)

OTHER PUBLICATIONS

Kumar, C. R., et. al., Experimental Study on Waste Heat Recovery from an IC Engine Using Thermoelectric Technology, Thermal Science, Dec. 2011, 1011, vol. 15, Issue 4.

(Continued)

*Primary Examiner* — Thomas Denion
*Assistant Examiner* — Diem Tran
(74) *Attorney, Agent, or Firm* — Turk IP Law, LLC

(57) ABSTRACT

Technologies are generally described for recovery of energy from engines. The described technology may be applied to systems, methods, and/or apparatuses. An example exhaust energy recovery apparatus (50) may include at least one thermal to electrical energy conversion element (60) having at least one side for thermal coupling along a substantial length (34, 35, 36) of an exhaust duct (30) for a combustion engine. The example apparatus (50) may also include a cover (52) located over at least a portion of the exhaust duct (30) adjacent to the at least one energy conversion element (60). A channel (53) may be formed between the cover (52) and an exterior portion of the exhaust duct (30), the channel having at least one inlet (54, 56) for admission of cooling fluid.

25 Claims, 5 Drawing Sheets

(51) Int. Cl.

| | | |
|---|---|---|
| *F01N 5/02* | (2006.01) | |
| *F02G 5/02* | (2006.01) | |
| *F28D 21/00* | (2006.01) | |
| *H01L 35/30* | (2006.01) | |
| *H01L 35/32* | (2006.01) | |
| *B60K 13/04* | (2006.01) | |
| *F01N 13/18* | (2010.01) | |

(52) U.S. Cl.
 CPC .............. *H01L 35/30* (2013.01); *H01L 35/325* (2013.01); *B60K 13/04* (2013.01); *F01N 13/1816* (2013.01); *F01N 2240/02* (2013.01); *Y02T 10/16* (2013.01); *Y02T 10/166* (2013.01)

(56) References Cited

U.S. PATENT DOCUMENTS

| | | | | |
|---|---|---|---|---|
| 6,820,419 | B2 * | 11/2004 | Ford et al. | 60/310 |
| 7,150,147 | B2 * | 12/2006 | Murata | 60/287 |

| | | |
|---|---|---|
| 2003/0140957 A1 | 7/2003 | Akiba |
| 2008/0245590 A1 | 10/2008 | Demirici et al. |
| 2011/0067742 A1 | 3/2011 | Bell et al. |

FOREIGN PATENT DOCUMENTS

| | | |
|---|---|---|
| WO | 9828524 A1 | 7/1998 |
| WO | 2004059138 A1 | 7/2004 |

OTHER PUBLICATIONS

International Search Report and Written Opinion for PCT/AU2012/001187 filed Sep. 28, 2012, mailed on Dec. 10, 2012.
Wojciechowski, K., et al., Study of Recovery of Waste Heat From the Exhaust of Automotive Engine, 5th European Conference on Thermoelectronics, Sep. 10-12, 2007.

* cited by examiner

EXHAUST ENERGY RECOVERY FOR ENGINES

CROSS-REFERENCE TO RELATED APPLICATIONS

This Application is the National Stage filing under 35 U.S.C. §371 of PCT Application Ser. No. PCT/AU12/001187 filed on Sep. 28, 2012 The disclosure of the PCT application is hereby incorporated by reference in its entirety.

TECHNICAL FIELD

The present disclosure relates generally to the recovery of energy from engines. Particularly, although not exclusively, the present disclosure concerns apparatuses, methods and systems for recovery of waste heat from the exhaust ducts of combustion engines, such as engines suited to automotive or stationary applications.

BACKGROUND

Unless otherwise indicated herein, the materials described in this section are not prior art to the claims in this application and are not admitted to be prior art by inclusion in this section.

In operation combustion engines (CEs) repeatedly ignite fuel-air mixtures in an enclosed space thereby generating continuous pulses or flows of extremely hot exhaust. The hot exhaust gases from combustion may be partially cooled during transit along the exhaust line and through various subassemblies integrated into the exhaust line or duct. Those subassemblies may, for example, include an engine gas condition monitoring bay, a catalytic convertor anti-pollution filter and one or more mufflers. The exhaust gases are finally dumped out of the system exhaust outlet(s) at temperatures still well above the boiling point of water—typically 140° C. or more.

This dumping of hot exhaust gas represents, apart from the composition of the exhaust gases, a significant energy wastage by combustion engines when considered in light of the calorific value of the fuel consumed. Engines equipped with a turbocharger harvest a little more of the energy in the flows of engine exhaust gas, but even after pushing the turbine blades of the turbocharger, the exhaust gas carries further energy in the form of heat.

Neither a turbine engine, a jet engine, a 2-stroke nor a 4-stroke engine's power cycles—whether petrol, diesel, aviation or gas-fuelled—is capable of utilising the waste heat remaining in the exhaust gases. In wintertime some of the waste heat can be harvested by a motor vehicle's internal (i.e. passenger cabin) heating system, but in summertime the waste heat may be completely unwanted and thus the waste heat appears principally at the exhaust outlet(s) of the vehicle, with smaller amounts emitted from the engine bulk in all directions by convection, conduction and radiation.

SUMMARY

Technologies are general described for recovery of energy from engines. The various described technologies may be applied to systems, methods, and/or apparatuses.

In one aspect of the disclosure, exhaust energy recovery apparatuses are described that include at least one thermal to electrical energy conversion element having at least one side for thermal coupling along a substantial length of an exhaust duct of an engine. Some example apparatuses may also include a cover located over at least a portion of the exhaust duct adjacent to the at least one energy conversion element and forming a channel between the cover and an exterior portion of the exhaust duct, the channel having at least one inlet for admission of cooling fluid.

In another aspect of the disclosure, methods of recovering energy from an engine are described. Some example methods include providing at least one thermal to electrical energy conversion element having at least one side for thermal coupling along a substantial length of an exhaust duct of the engine. Some energy recovery methods may further include channeling a flow of cooling fluid along an exterior of the exhaust duct and over another side of the energy conversion elements and recovering electrical energy produced by the at least one element at an electrical output of the at least one element.

In a further aspect of the disclosure, systems for exhaust energy recovery are described. Some example systems include at least one array of thermal to electrical energy conversion elements having one side thermally coupled to an exhaust duct of an engine for generating electrical energy from exhaust gases carried by the duct. Some example systems may also include a cover located over at least a portion of the exhaust duct adjacent to the at least one array of energy conversion elements and forming a channel between the cover and an exterior portion of the exhaust duct, the channel having at least one opening for admission of cooling fluid which flows along the channel. The array(s) of energy conversion elements may have another side thermally coupled to a flow of cooling fluid in the channel formed by the cover and also have an electrical output connected to an electrical sub-system associated with the engine, whereby heat energy from the exhaust gases can be converted into electrical energy and supplied to the electrical sub-system.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 7a is a fragmentary oblique view of a wall portion of an exhaust duct having a substantially square shape in cross-section;

FIG. 7b is a fragmentary oblique view of a wall portion of an exhaust duct having a substantially rectangular shape in cross-section;

FIG. 7c is a fragmentary oblique view of a wall portion of an exhaust duct having a substantially trapezoidal shape in cross-section;

FIG. 7d is a fragmentary oblique view of a wall portion of an exhaust duct having an inverted substantially trapezoidal shape in cross-section;

FIG. 7e is a fragmentary oblique view of a wall portion of an exhaust duct having a substantially triangular shape in cross-section;

FIG. 7f is a fragmentary oblique view of a wall portion of an exhaust duct having a substantially square shape in cross-section, with an alternative construction compared with FIG. 7a;

FIG. 7g is a fragmentary oblique view of a wall portion of an exhaust duct having a substantially rectangular shape in cross-section, with an alternative construction compared with FIG. 7b;

FIG. 7h is a fragmentary oblique view of a wall portion of an exhaust duct having a substantially trapezoidal shape in cross-section, with an alternative construction compared with FIG. 7c;

FIG. 7i is a fragmentary oblique view of a wall portion of an exhaust duct having an inverted substantially trapezoidal shape in cross-section, having an alternative construction compared with FIG. 7d; and FIG. 7j is a fragmentary oblique view of a wall portion of an exhaust duct having a substantially triangular shape in cross-section, having an alternative construction compared with FIG. 7e, all arranged in accordance with at least some embodiments described herein.

DETAILED DESCRIPTION

Figure 1:
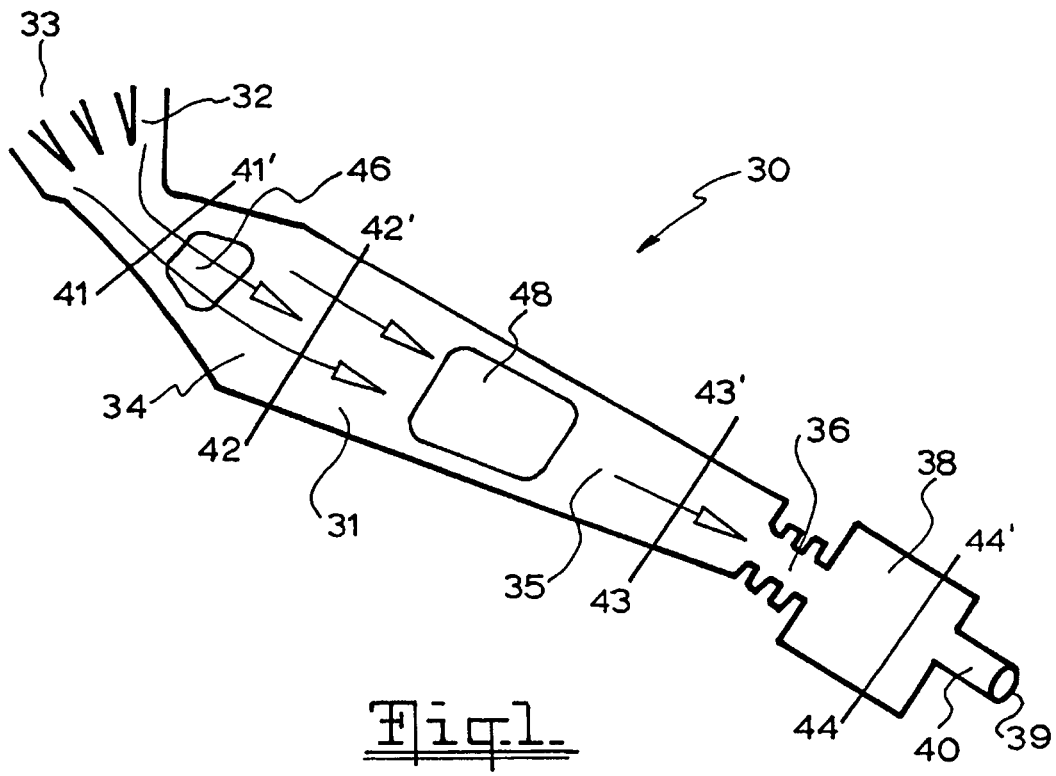
FIG. 1 is an elevational view of an example exhaust duct for an engine.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the drawing figures, can be arranged, substituted, combined, separated, and designed in a wide variety of different configurations, all of which are explicitly contemplated herein.

This disclosure is directed generally to apparatus, methods and systems for recovery of waste heat from the exhaust ducts of engines, such as internal combustion engines suited to automotive or stationary applications.

In one aspect, exhaust energy recovery apparatuses are described that include at least one thermal to electrical energy conversion element having at least one side for thermal coupling along a substantial length of an exhaust duct of an engine. Some example apparatuses may also include a cover located over at least a portion of the exhaust duct adjacent to the at least one energy conversion element and forming a channel between the cover and an exterior portion of the exhaust duct, the channel having at least one inlet for admission of cooling fluid.

Also disclosed in some embodiments is at least one thermal to electrical energy conversion element which may have at least one side for thermal coupling along the exhaust duct between the engine and an exhaust muffler.

Also disclosed in some embodiments is an exhaust energy recovery apparatus that may include at least one array of the at least one thermal to electrical energy conversion element. The at least one element may form any one or more of a thermoelectric generator, a thermo-ionic converter or a pyro-electric converter.

Disclosed in some embodiments, the at least one element may be thermally coupled to the exhaust duct by fixing to the exterior surface of the exhaust duct by a thermally conductive fixing agent and thermally coupled to a flow of cooling fluid in the channel by a heat exchange structure. The heat exchange structure may include fins or plates disposed in the cooling fluid flow.

Disclosed in some embodiments, the exhaust duct may include a substantially tubular portion which diverges from an inlet end and converges toward an outlet end. The diverging tubular portion may diverge and/or the converging tubular portion may converge arithmetically.

Disclosed in some embodiments, the cover may include an outer wall having circumferential corrugations providing increased surface area.

Disclosed in some embodiments, the exhaust duct may have a substantially polygonal cross-sectional shape including a plurality of flat exterior surface portions, at least one of which may be arranged for coupling to the at least one conversion element.

Also disclosed in some embodiments, the cover can protect the at least one energy conversion element and the at least one inlet of the channel may include a filter for excluding loose debris from the channel. The at least one inlet may include an open end of the channel over which the filter is located.

Disclosed in some embodiments, the channel may include a substantially annular cross-sectional shape disposed circumferentially about the exhaust duct. The cover may be evenly spaced from the exhaust duct and optionally be constructed from at least two longitudinal sections fixed together at axial seam portions. The cover may further include at least one access port for access to components of the exhaust duct.

Disclosed in some embodiments, an access port may be provided for access to an engine condition sensor bay, a catalytic convertor, exhaust muffler or similar exhaust duct component. If required, an openable door may be provided for covering the access port.

Disclosed in some embodiments, the at least one element may include an electrical output coupled to a power regulator for supplying power to engine ancillaries.

In another aspect of the disclosure, there are provided systems for exhaust energy recovery in a combustion engine system or vehicle or craft powered by an engine including the exhaust energy recovery apparatus as described above. Some example systems may include a cover associated with the exhaust duct is arranged such that motion of the vehicle or craft induces fluid flow in the channel.

Disclosed in some embodiments of the systems, an electrical output of the at least one array of thermal to electrical energy conversion elements may be connected to the engine, vehicle or craft electrical system. The electrical output may be coupled via a power regulator to a storage battery and/or an accessory circuit of the electrical system.

Also disclosed in some embodiments of the systems where the engine or vehicle normally operates in open air, the cooling fluid may include air. Alternatively, in some embodiments of the systems where the engine or vehicle normally operates in a body of water, the cooling fluid may include water.

In a further aspect of the disclosure, methods of recovering energy from an engine are described. Some example methods include the steps of providing at least one thermal to electrical energy conversion element having at least one side for thermal coupling along a substantial length of an exhaust duct of the engine. Some energy recovery methods may further include channeling a flow of cooling fluid along an exterior of the exhaust duct and over another side of the energy conversion elements, and recovering electrical energy produced by the at least one element at an electrical output of the at least one element.

In some embodiments the providing step may include fixing the at least one element to an exterior surface of the exhaust duct. Suitably the fixing sub-step includes fixing the at least one element between the engine and an exhaust muffler.

Disclosed in some embodiments, the providing step may include providing at least one array of thermal to electrical energy conversion elements.

Disclosed in some embodiments, the channeling step may include locating a cover having at least one inlet over a portion of the exhaust duct adjacent to the at least one element. The channeling step may include protecting the at least one element from impact by loose debris, suitably by filtering the fluid admitted into the cover.

Also disclosed in some embodiments, the recovering step includes production of electrical energy by any one or more of a thermoelectric effect, by a thermo-ionic effect or by a pyroelectric effect.

In a further aspect of the disclosure, systems for exhaust energy recovery are described. Some example systems include at least one array of thermal to electrical energy conversion element having one side thermally coupled to an exhaust duct of an engine for generating electrical energy from exhaust gases carried by the duct. Some example systems may also include a cover located over at least a portion of the exhaust duct adjacent to the at least one array of energy conversion elements and forms a channel between the cover and an exterior portion of the exhaust duct, the channel having at least one opening for admission of cooling fluid which flows along the channel. The array(s) of energy conversion elements may have another side thermally coupled to the flow of cooling fluid in the channel formed by the cover and may also have an electrical output connected to an electrical subsystem associated with the engine, whereby heat energy from the exhaust gases can be converted into electrical energy and supplied to the electrical sub-system.

Disclosed in other embodiments, the exhaust duct may include a substantially tubular portion which diverges from an inlet end and converges toward an outlet end.

The present disclosure is generally concerned, in some embodiments, with reclaiming waste engine heat in combustion engines (CEs) by conversion into electricity. In particular embodiments of the disclosure, an apparatus is described that can harvest waste from the exhaust outlets of combustion engines or turbines using heat to electrical energy converters, which may include a plurality of individual elements. Internal combustion engine (ICE) exhaust ducts may particularly provide a viable heat energy source for heat to electric energy conversion elements, such as found in thermoelectric (TE), thermo-ionic (TI) or pyroelectric (PR) heat conversion element arrays or modules, which also may assist in ejecting exhaust gases at lower temperatures in addition to recovering waste energy as electrical current for various uses. Such end uses for the engine or turbine may include "trickle" recharging of a starter battery or operating low-power electrical accessories within a vehicle, such as fans, interior lights, screen demisters, mobile phones, back-of-seat view screens, etc.

Examples of commercially available conversion element arrays or modules that may be suitable for use in accordance with the present disclosure may include the thermo-electric (TE) generators available from Custom Thermoelectric, Inc. of Bishopville, Md. in the United States of America, including Part. No 1261G-7L31-04CL which include BiTe conversion elements. Materials for conversion elements other than BiTe might also be utilized, including for example PbTe or $Zn_xAl_yO_z$ nanocomposites or other suitable materials.

FIG. 1 is an elevational view of an exhaust duct arranged in accordance with at least some embodiments described herein. The exhaust duct 30 can be used for carrying an exhaust gas stream or flow 31. The exhaust duct 30 may be used in whole or in part in place of known exhaust ducts. The exhaust duct 30 of the embodiment desirably has a wall configuration for maximizing the available substantially flat surface portions. The exhaust duct 30 includes a manifold portion 32 with header pipes for connection at an inlet end 33 to an engine block (not shown). Proceeding longitudinally from the inlet end 33 of the duct 30, there is provided a divergent pipe portion 34, a convergent pipe portion 35, an expansion pipe portion 36, an exhaust muffler 38 and a tail pipe portion 40, from which the exhaust gases exit at an outlet end 39. Possible cross-sectional shapes of the exhaust duct 30, including at location 41-41' of the divergent pipe portion 34, locations 42-42' and 43-43' of the convergent pipe portion 35, and location 44-44' of the exhaust muffler 38 are described further below in relation to FIGS. 7a-j. The duct cross-section may depart temporarily from these shapes in, for example, the expansion-accommodating regions such as the "bellows" configuration expansion pipe portion 36 before the muffler 38. Other wall shapes may also be utilized as desired and/or to suit functional or fitting requirements. The exhaust duct 30 of this example also includes first and second access ports 46, 48 which are provided for access to an engine condition monitoring chamber and a catalytic convertor, respectively.

The functions of the various components of the exhaust duct 30 may be integrated together into fewer components, divided into additional components, or provided as different sub-assemblies depending on the desired implementation.

The divergent and convergent portions 34, 35 of this embodiment of the exhaust duct 30 provide a relatively larger surface area compared with conventional exhaust ducts for mounting arrays of heat-to-electrical energy conversion elements (see FIG. 3) to be thermally coupled with the exhaust gas stream 31. The divergent and convergent portions 34, 35 of this embodiment are also arranged for increased and/or consistent heat extraction from exhaust gases passing therethrough. This is achieved in the following manner. Hot exhaust gases entering the exhaust duct 30 via the inlet 33 expand in the divergent portion 34. As heat is progressively extracted from the exhaust gases, the gases contract in volume. The convergent portion 35 of the exhaust duct 30 of this embodiment is therefore arranged for improved heat extraction from the contracting gases passing therethrough maintaining consistent contact with the contracting gases. Generally, this combination of divergent followed by convergent portions 34, 35 may assist in maximizing heat extraction by encouraging heat transfer at a constant maximum over the duct wall for greater energy collection. Furthermore, in this embodiment, the length of the divergent portion 34 is less than the length of the convergent portion 35, by a factor of 1:4. As will be understood, in alternative arrangements, this ratio may be different, for example 1:2, 1:1, 2:1, 4:1.

Figure 2:
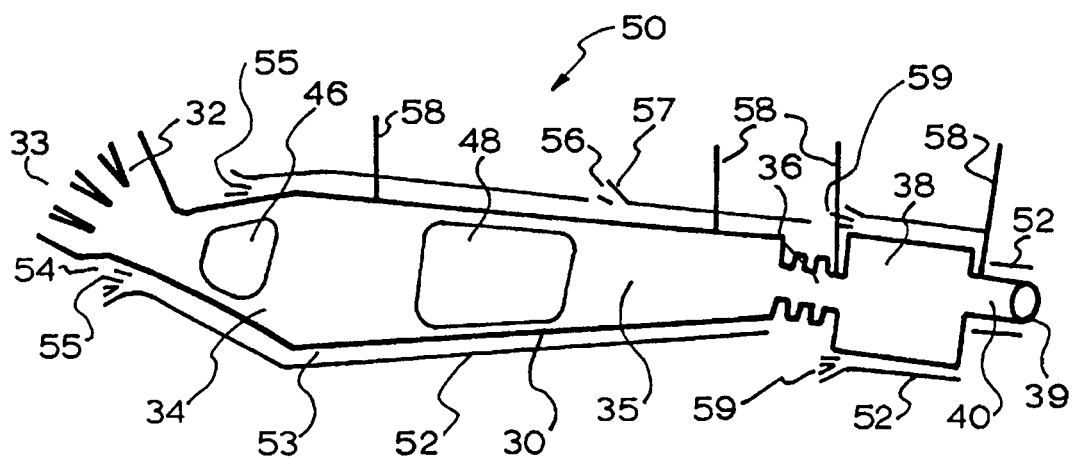
FIG. 2 is a longitudinal sectional elevational view of the exhaust duct of FIG. 1 including a protective cover of an embodiment of the exhaust energy conversion apparatus, where the section is taken along the length of the duct and cover on a plane parallel to the page.

FIG. 2 is a longitudinal sectional elevational view of the exhaust duct of FIG. 1 of an embodiment of the exhaust energy recovery apparatus 50 including a protective cover 52, arranged in accordance with at least some embodiments described herein. The protective cover 52 can be installed over the exhaust duct 30 to shield arrays of heat-to-electrical energy conversion elements (described further below in relation to FIG. 3) and its connecting wires/cables from impact by loose debris, including stones, grit, dust, rain, mud, etc., which may otherwise cause damage when a vehicle on which the duct is installed is moving. A space or channel 53 can be formed between the exhaust duct 30 and protective cover 52 to guide a flow of cooling fluid 70, in this case air, to continually transit over the heat-to-electrical energy conversion element arrays 60 (e.g., see FIG. 4). The cooling fluid flow may result from movement of the vehicle and/or (for example when the vehicle is stationary or in a stationary engine application), a forced flow may be required which might be derived from the engine cooling fan or other coolant circuit.

In some embodiments, the channel 53 will be substantially annular in cross-section, extending partially, substantially or entirely around the exhaust duct 30. The cover 52 can be supported on the exhaust duct by spacer members 58, here disposed both on the convergent pipe portion 36 and on the muffler 38. Suitably, the spacer members can be adapted to provide thermal insulation between the exhaust duct 30 and the cover 52, as shown in more detail in FIG. 4.

The cover 52 includes an intake 54 at one end, generally adjacent to the inlet end 33, which can admit cooling air into the channel 53. A further lateral intake 56 may also be provided in the cover 52 to admit fresh, relatively cool air at about midway along the length of channel 53, as desired. It may be desirable to provide each of the air intakes 54, 56 of this protective cover 52 with a filter 55, 57, such as a grille or mesh, configured to exclude pebbles, grit or large dust grains from entering the airflow channel 53. Any number of air intakes can be optionally included to admit fresh, relatively cool air into any appropriate region of the exhaust energy recovery apparatus 50, for example the intake 59 at the muffler portion of the cover 52 as depicted in FIG. 2.

Whilst FIGS. 1 and 2 depict the muffler 38 as being separate from the "converging" section pipe portion 35 of the exhaust duct 30, this is merely one possible arrangement. In one alternative, the muffler 38 may instead be integrated into an end portion of a continuous converging section of the exhaust duct, referred to herein as a "maximally monolithic" exhaust duct configuration. Similarly, if desired or considered appropriate, other "expansion allowance" pipe portions, such as expansion portion 36 in FIGS. 1 and 2, can be included elsewhere along the exhaust duct 30. For example an expansion allowance may be provided part way along the convergent portion 35 of the exhaust duct 30. The expansion allowance pipe portions 36 may also, for example, be constructed of a resilient plastics material, such as PTFE channel, or a suite of contractible ports in parallel, for example three stainless steel bellows sections arranged side-by-side.

Further shown in FIG. 2 are the engine condition sensor bay access port 46 and the catalytic convertor access port 48, as also illustrated in FIG. 1. These ports are desirable in order to gain access to any interior components which may require at least the protective cover 52 to be openable. The access ports 46, 48 can include doors which may be accessible merely by releasing fixing means such retaining screws, clips etc. In some alternative arrangements, the ports can be constructed with a "drawer" style construction whereby unscrewing, unclipping etc. may be utilized to allow a component within (e.g. an exhaust gas sensor head, catalyst carrier, etc.) to be slid outwardly from the exhaust duct 30 like a drawer. Similar approaches to modify access can also be used, as required, on the "muffler" section: Rather than the muffler 38 being a separate unit, it may instead be installed as a slide-in drawer section at the end of the convergent pipe portion 35 of the exhaust duct 30.

Figure 3:
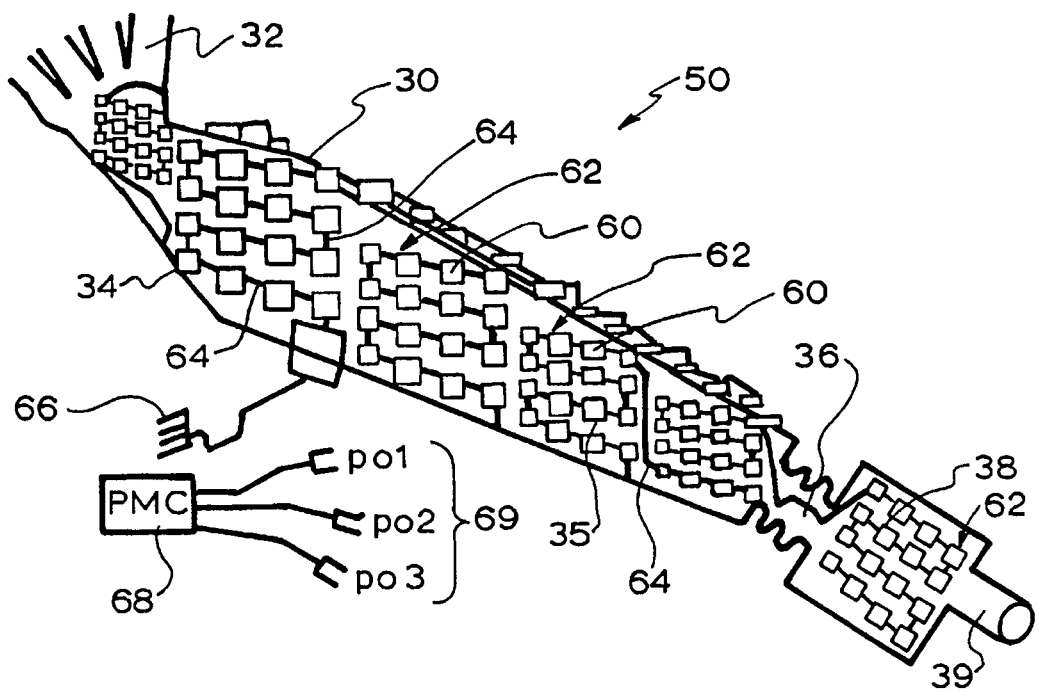
FIG. 3 is an elevational view of the exhaust duct of FIG. 1 fitted with energy conversion element arrays of an embodiment of the exhaust energy conversion apparatus.

FIG. 3 is an elevational view of the further exhaust duct of FIG. 1 fitted with energy conversion element arrays of an embodiment of the exhaust energy conversion apparatus, arranged in accordance with at least some embodiments described herein. The illustrated exhaust duct 30 is similar to that employed in the exhaust energy recovery apparatus of FIG. 2, but, for purposes of clarity, without the protective cover 52.

As illustrated in FIG. 3, the exhaust duct may have a plurality of parallel groups 62 of interconnected heat to electrical energy conversion modules or arrays 60 suitably fixed to the outer surface of the wall of exhaust duct 30. The energy conversion arrays 60, in the example connected in series, can be added to any suitable surface along the length of the exhaust duct 30. Example suitable surfaces may include duct walls where sufficient flat surface area is available for fixing the element 60 concerned, either mechanically in combination with a thermally conductive layer or with a thermally conductive adhesive, to ensure good thermal contact between individual TE modules and exhaust duct wall. Examples of thermally conductive layers include the TF-4040 graphite thermal interface foil available from Custom Thermoelectric, Inc. or Molykote P37 paste (−30° C. to +1400° C.) available from Dow Corning; whilst an adhesive example is the thermally conductive epoxy (Product No. EP21ANHT) available from MasterBond Corp. of Hackensack, N.J. in the United States of America.

The energy conversion element arrays 60 may be electrically interconnected in groups 62 by conductors 64, which groups may then be coupled to a power management controller (PMC) 68 via a power interface 66. The PMC, if required, may be arranged to dynamically configure the series and/or parallel connections of various arrays of the energy conversion elements so as to extract power at a controlled voltage level (e.g. 12V-14V DC). One or more power outlet sockets 69 may be configured to draw electrical power from the controller 68 and route the drawn electrical power to one or more nodes in the engine or vehicle electrical system, e.g. po1, po2, po3. It will be appreciated that other voltages may also be supplied, such as 24V DC for heavy vehicles, as may be required.

The outer protective cover 52 (described in relation to FIG. 2 above) is configured to protect the active heat to electrical energy convertor arrays 60 from damage by debris, such as material dislodged and/or impacted by a vehicle as it moves. The outer protective cover in one example is also configured to simultaneously allow passing air to come in contact with the outer surfaces of the energy conversion elements, since this outer surface is a "cold junction" plane of the elements. Further details concerning the outer protective cover 52 and operating relationship with the energy conversion element arrays 60 are described in relation to FIGS. 4 and 5 below.

Figure 4:
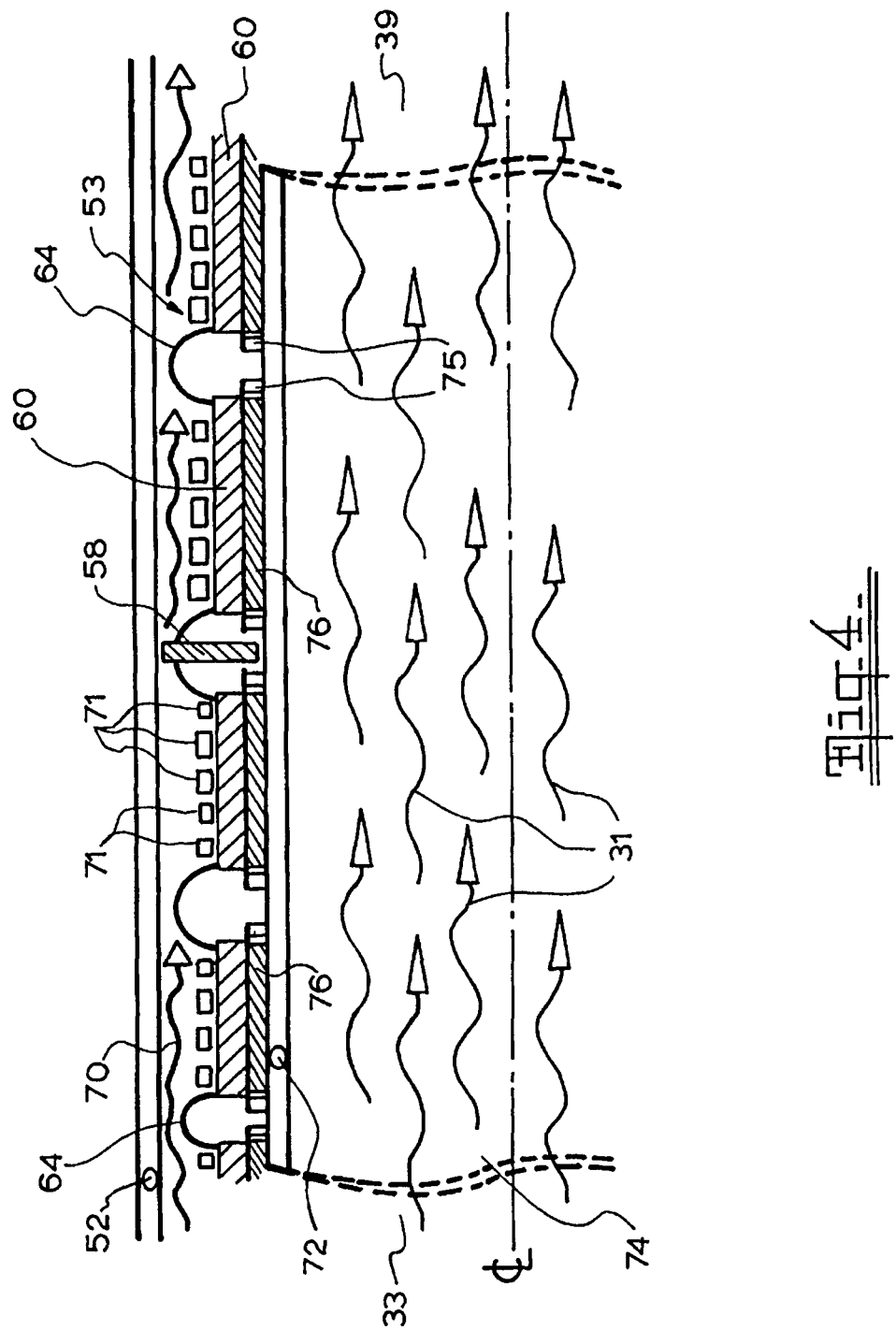
FIG. 4 is an enlarged fragmentary cross-sectional view of the exhaust duct of FIG. 3.

FIG. 4 is an enlarged fragmentary cross-sectional view of the further exhaust duct of FIG. 3, arranged in accordance with at least some embodiments described herein. As illustrated, exhaust duct 30 is configured to facilitate coolant fluid flow 70 through the passage 53 exterior to the duct wall 72 and exhaust gas flow 31 interior of the duct wall 72, between an inlet end 33 and an outlet end 39 within exhaust chamber 74. The protective cover 52 forming the passage 53 for the coolant flow 70 is provided with support members 58, as also shown. The mounting arrangement of a plurality of heat to electrical energy convertor arrays 60 on an exterior surface of the exhaust duct wall 72, includes in this embodiment attachment means 75 (such as screws or rivets), together with a heat coupling layer 76 (such as a foil or a paste) to ensure thermal conductivity between the exhaust duct wall 72 and a "hot"

side of the converter arrays 60. A heat exchange arrangement, here in the form of cooling fins 71, is coupled to a "cool" side of the converter arrays 60 and exposed to the coolant flow 70. Electrical interconnects 64 may be looped between adjacent arrays 60 remote from the exhaust duct wall 72 in order to connect the convertor arrays into groups, as described above and shown schematically in FIG. 3.

Figures 5A, 5B:
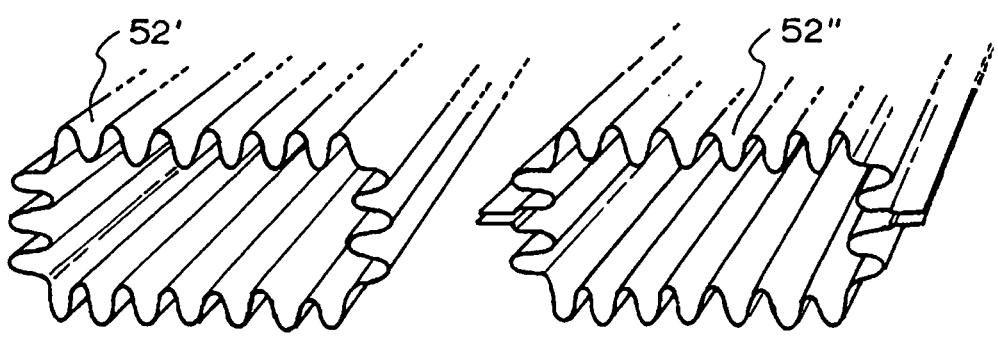
FIG. 5a is a fragmentary oblique view of a wall portion of a protective cover of a further embodiment of the exhaust energy conversion apparatus.
FIG. 5b is a fragmentary oblique view of a variation of the wall portion of a protective cover showing an alternative construction.

FIG. 5a is a fragmentary oblique view of a wall portion of a protective cover of a further embodiment of the exhaust energy conversion apparatus, while FIG. 5b is a fragmentary oblique view of a variation of the wall portion of a protective cover showing an alternative construction, both arranged in accordance with various embodiments described herein. It may be desirable to operate the energy-harvesting exhaust duct with the outer protective cover remaining as cool as practicable. Hence, in some embodiments the protective cover 52' may include an undulating wall that is effectively "finned", as depicted in FIG. 5a; to provide increased surface area for conduction cooling of the air passing between the inner exhaust duct and outer protective cover.

An alternative embodiment of the protective cover 52", depicted in FIG. 5b shows how the outer envelope may be constructed as two halves which meet along flanged edges and are appropriately fixed (such as clamped, screwed or clipped) together as would be understood by one skilled in the relevant arts. Techniques of material forming, cupping, stamping, welding, gluing, sealing, molding, soldering and adhering etc., as suited to either sheet steel or fiberglass, can be utilized for fabricating the protective cover of the embodiment. These materials should be specified to handle operating temperatures of around 300° C., which in the case of fiberglass could utilize a high temperature thermosetting type resin.

Figure 6B:
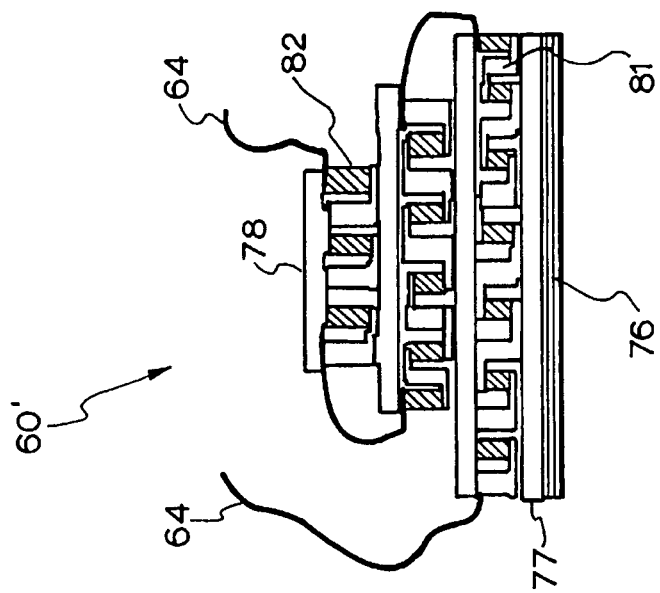
FIGS. 6a & 6b are detailed side views of alternative energy conversion element array embodiments.
Figure 6A:
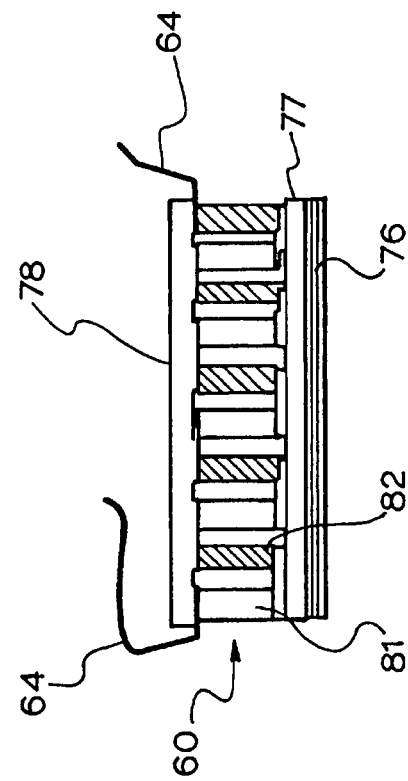
Figure 7:
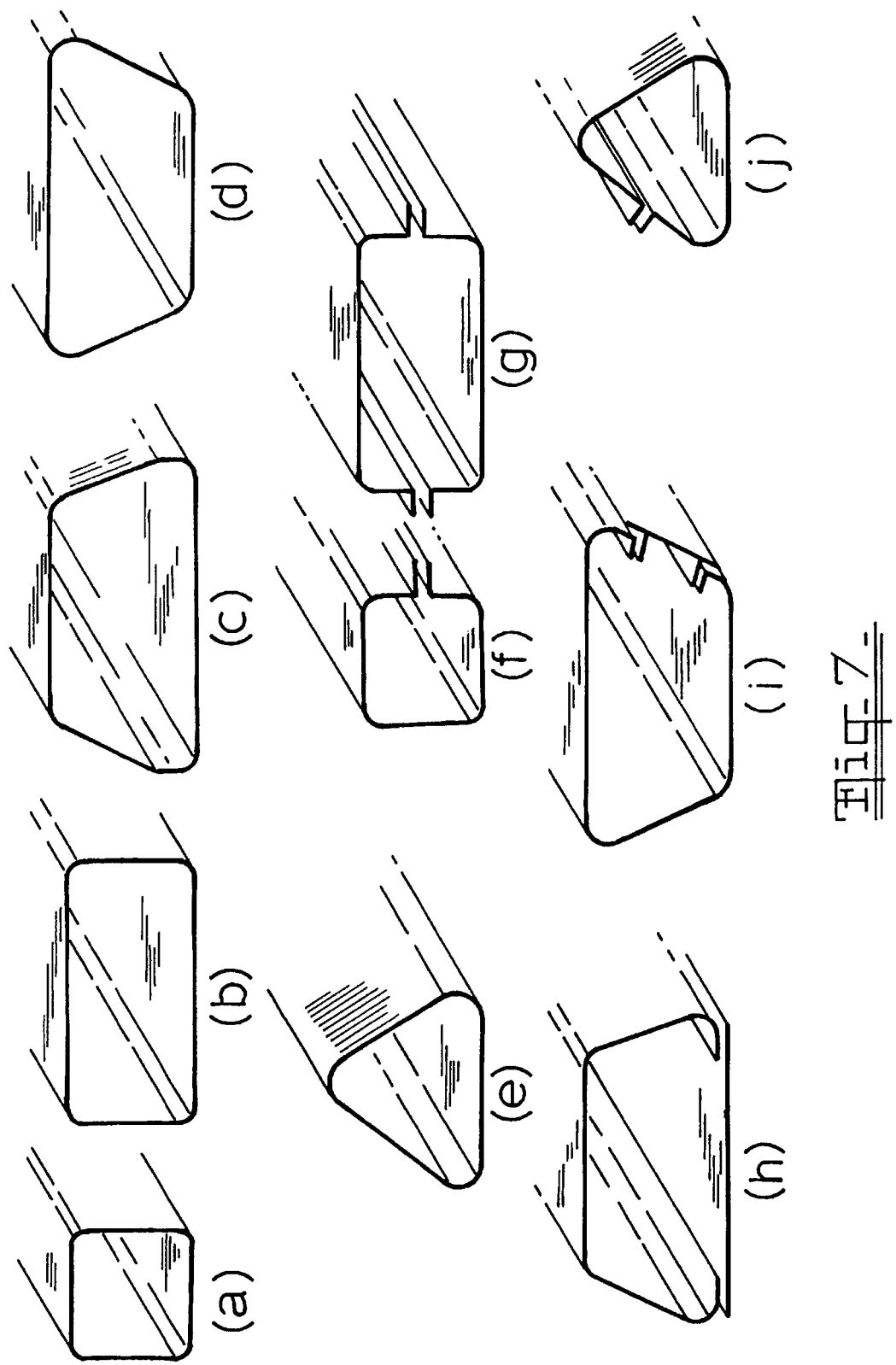

FIGS. 6a and 6b are detailed side views of alternative energy conversion element array embodiments, arranged in accordance with at least some embodiments described herein. In the detailed side view of energy convertor array 60 as depicted in FIG. 6a, individual TE elements are illustrated as p-type elements 81 and n-type elements 82, provided in an alternating arrangement as suited to the embodiment of FIG. 6, having a "hot" side 77 and a "cool" side 78, where "hot" and "cool" are relative terms and refer to the system while in use. In the alternative embodiment of an energy convertor array 60' shown in FIG. 6b, p-type elements 81 and n-type elements 82 are provided in a triple-layer stacked arrangement. As will be understood, other alternative configurations of p-type and n-type elements may be used, such as in other stacking arrangements.

FIGS. 7a to 7e show fragmentary oblique views of example exhaust ducts having cross-sections that are of a substantially square shape, a substantially rectangular shape, a substantially trapezoidal shape, an alternative substantially trapezoidal shape, and a substantially triangular cross-sectional shape, all arranged in accordance with various embodiments described herein.

FIGS. 7f to 7j show fragmentary oblique views of further example exhaust ducts having cross-sections that are of a substantially square shape, a substantially rectangular shape, a substantially trapezoidal shape, an alternative substantially trapezoidal shape, and a substantially triangular shape, but of piece-wise tubular form having one or more longitudinal seams for joining one or more relatively flat wall portions.

The exhaust ducts illustrated in FIGS. 7a to 7j can be of a tubular form with relatively high ratio of flat, planar wall portions to corners. The corners, where the flat portions meet, generally may have substantially minimal radius for promoting effective gas flow. A benefit in having a high ratio of flat, planar wall portions to corners is that there is a relatively large surface area for mounting conversion elements on a flat, planar surface, rather than a rounded surface. As common conversion elements tend to be commercially available in flat, planar configurations, it may be easier to mount such conversion elements to the ducts illustrated in FIGS. 7a to 7j in comparison with rounded ducts.

In order to maximize the surface area available for mounting heat to electrical energy conversion elements to the walls of an exhaust duct, including these subassemblies, it may be desirable to have as many substantially flat surfaces as possible. Further relatively compact or short curved regions can desirably be employed to join adjacent flat walls at edges and corners. It will be appreciated that curves may not be totally eliminated in the inventive exhaust system, since they may be necessary for promoting smooth gas flow, corrosion-resistance and satisfactory expansion and contraction when the pipe sections and sub-assemblies are subjected to cyclical heating and cooling.

In light of the present disclosure, one skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled.

In one example of a variant, it will be appreciated that where a vehicle powered by an engine to which the exhaust energy recovery apparatus of the disclosure has been applied may normally operate in a body of water, for example a ship boat, or personal watercraft (such as a jet ski), the cooling fluid utilized may include water rather than air.

It is to be understood that this disclosure is not limited to particular methods, reagents, compounds or compositions which can, of course, vary. It is also to be understood that the terminology used herein is for the purpose of describing particular embodiments only, and is not intended to be limiting. With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C; etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a array having 1-3 elements refers to arrays having 1, 2, or 3 elements. Similarly, a array having 1-5 elements refers to arrays having 1, 2, 3, 4, or 5 elements, and so forth.

The exhaust energy conversion apparatus of the disclosure permits existing manufacturers of engine exhaust ducts and/or related sub-assemblies to offer a unified product which ejects exhaust gases at a lower temperature and converts waste engine heat into useable electricity, for example at 12V DC, 24V DC or any other viable voltage level.

The apparatuses and methods of the disclosure may be applied on assembly lines currently producing conventional exhaust lines or associated components such as exhaust gas monitoring chambers, catalytic convertor (anti-pollution) assemblies and mufflers. Such applications can provide an additional low-current electricity outlet when the energy conversion apparatus is part of a stationary engine (e.g. a drive for a large air compressor or an electric generator).

By building and supplying harvesting exhaust lines in accordance with the present disclosure, more of the energy content of the engine fuel is useable and less energy will appear in the form of wasteful hot exhaust. Engines equipped with an energy conversion apparatus in accordance with the disclosure may contribute less to urban and global warming. Such energy conversion systems can also help reduce fuel consumption and lower urban and thereby contribute to managing global warming.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The invention claimed is:

1. An exhaust energy recovery apparatus, comprising:
at least one thermal to electrical energy conversion element having at least one side for thermal coupling along a substantial length of an exhaust duct of an engine, wherein the exhaust duct includes a substantially tubular portion comprising a diverging tubular portion contiguous to a converging tubular portion, wherein the substantially tubular portion first diverges from an inlet end to enable hot exhaust gases entering the exhaust duct via the inlet end to expand in the diverging tubular portion, and then continuously converges toward an outlet end to enable the exhaust gases to enter the converging tubular portion for maintenance of consistent contact of the exhaust duct with the exhaust gases as the exhaust gases contract from progressive heat extraction in order to maximize the heat extraction; and
a cover located over at least a portion of the exhaust duct adjacent to the at least one thermal to electrical energy conversion element and forming a channel between the cover and an exterior portion of the exhaust duct, the channel having at least one inlet for admission of cooling fluid.

2. The apparatus of claim 1, wherein the at least one thermal to electrical energy conversion element has at least one side for thermal coupling along the exhaust duct between the engine and an exhaust muffler.

3. The apparatus of claim 1, further comprising at least one array of the at least one thermal to electrical energy conversion element.

4. The apparatus of claim 1, wherein the at least one thermal to electrical energy conversion element forms a thermo-electric generator, a thermo-ionic converter, or a pyro-electric converter.

5. The apparatus of claim 1, further comprising a plurality of thermal to electrical energy conversion elements including the at least one thermal to electrical energy conversion element, wherein the plurality of thermal to electrical energy conversion elements includes a first thermal to electrical energy conversion element located on the diverging tubular portion and a second thermal to electrical energy conversion element located on the converging tubular portion.

6. The apparatus of claim 1, wherein one or both of the diverging tubular portion diverges arithmetically and the converging tubular portion converges arithmetically.

7. The apparatus of claim 1, wherein the cover includes an outer wall having circumferential corrugations providing increased surface area.

8. The apparatus of claim 1, wherein the at least one thermal to electrical energy conversion element is thermally coupled to the exhaust duct by fixing to the exterior portion of the exhaust duct by a thermally conductive fixing agent and thermally coupled to flow of the cooling fluid by a heat exchange structure.

9. The apparatus of claim 8, wherein the heat exchange structure includes fins or plates disposed in the cooling fluid flow.

10. An exhaust energy recovery apparatus, comprising:
at least one thermal to electrical energy conversion element having at least one side for thermal coupling along a substantial length of an exhaust duct of an engine, wherein the exhaust duct has a substantially polygonal cross-sectional shape including a plurality of flat exterior surface portions, at least one of which is arranged for coupling to the at least one thermal to electrical energy conversion element, and includes a substantially tubular portion which diverges from an inlet end and converges toward an outlet end; and
a cover comprising an undulating wall located over at least a portion of the exhaust duct adjacent to the at least one thermal to electrical energy conversion element supported by one or more spacer members adapted to provide thermal insulation between the portion of the exhaust duct and the cover and forming a channel between the cover and an exterior portion of the exhaust duct, the channel having at least one inlet for admission of cooling fluid.

11. The apparatus of claim 10, wherein the channel has a substantially annular cross-sectional shape disposed circumferentially about the exhaust duct.

12. The apparatus of claim 10, wherein the cover is evenly spaced from the exhaust duct and is constructed from at least two longitudinal sections fixed together at axial seam portions.

13. The apparatus of claim 10, wherein the at least one thermal to electrical energy conversion element includes an electrical output coupled to a power regulator for supplying power to engine ancillaries.

14. The apparatus of claim 10, wherein the cover protects the at least one thermal to electrical energy conversion element and the at least one inlet of the channel includes a filter for excluding loose debris from the channel.

15. The apparatus of claim 14, wherein the at least one inlet includes an open end of the channel over which the filter is located.

16. The apparatus of claim 10, wherein the cover includes at least one access port for access to components of the exhaust duct.

17. The apparatus of claim 16, wherein the access port is provided for access to an engine condition sensor bay, a catalytic convertor, exhaust muffler,. or similar exhaust duct component.

18. The apparatus of claim 16, further comprising an openable door for covering the access port.

19. A method to recover energy from an engine, the method comprising:
providing at least one thermal to electrical energy conversion element having at least one side for thermal coupling along a substantial length of an exhaust duct of the engine, wherein the exhaust duct has a substantially polygonal cross-sectional shape including a plurality of flat exterior surface portions, at least one of which is arranged for coupling to the at least one thermal to electrical energy conversion element, and includes a substantially tubular portion comprising a diverging tubular portion contiguous to a converging tubular portion, wherein the substantially tubular portion first diverges from an inlet end to enable hot exhaust gases entering the exhaust duct via the inlet end to expand in the diverging tubular portion, and then continuously converges toward an outlet end to enable the exhaust gases to enter the converging tubular portion for maintenance of consistent contact of the exhaust duct with the exhaust gases as the exhaust gases contract from progressive heat extraction in order to maximize the heat extraction;
channeling a flow of cooling fluid along an exterior of the exhaust duct and over another side of the thermal to electrical energy conversion element; and
recovering electrical energy produced by the at least one thermal to electrical energy conversion element at an electrical output of the at least one thermal to electrical energy conversion element.

20. The method of claim 19, wherein channeling includes locating a cover having at least one inlet over a portion of the exhaust duct adjacent to the at least one thermal to electrical energy conversion element.

21. The method of claim 19, wherein recovering includes production of electrical energy by a thermoelectric effect, by a thermo-ionic effect, or by a pyro-electric effect.

22. The method of claim 19, wherein providing includes fixing the at least one thermal to electrical energy conversion element to an exterior surface of the exhaust duct.

23. The method of claim 22, wherein fixing includes fixing the at least one thermal to electrical energy conversion element between the engine and an exhaust muffler.

24. The method of claim 19, wherein channeling includes protecting the at least one thermal to electrical energy conversion element from impact by loose debris.

25. The method of claim 24, wherein protecting the at least one thermal to electrical energy conversion element includes filtering the fluid admitted into a cover.

* * * * *

UNITED STATES PATENT AND TRADEMARK OFFICE
CERTIFICATE OF CORRECTION

| | | |
|---|---|---|
| PATENT NO. | : 9,157,359 B2 | Page 1 of 1 |
| APPLICATION NO. | : 13/976440 | |
| DATED | : October 13, 2015 | |
| INVENTOR(S) | : Bewlay | |

It is certified that error appears in the above-identified patent and that said Letters Patent is hereby corrected as shown below:

In the Specification

In Column 1, Line 8, delete "§371" and insert -- § 371 --, therefor.

In Column 4, Line 67, delete "duet" and insert -- duct --, therefor.

In Column 5, Line 56, delete "thermo-ionic" and insert -- thermoionic --, therefor.

In Column 6, Line 3, delete "Part." and insert -- Part --, therefor.

In Column 7, Line 64, delete "section:" and insert -- section. --, therefor.

In Column 9, Line 18, delete "FIG. 5a;" and insert -- FIG. 5a, --, therefor.

In Column 11, Line 22, delete "A, B, and C;" and insert -- A, B, and C, --, therefor.

In the Claims

In Column 14, Line 6, in Claim 6, delete "muffler,." and insert -- muffler, --, therefor.

Signed and Sealed this
Twenty-third Day of February, 2016

Michelle K. Lee
*Director of the United States Patent and Trademark Office*